United States Patent [19]

Tanaka

[11] Patent Number: 5,452,326
[45] Date of Patent: Sep. 19, 1995

[54] DIGITAL PLL CIRCUIT WITH LOW POWER CONSUMPTION

[75] Inventor: Masato Tanaka, Tokyo, Japan

[73] Assignee: Sony Corporation, Tokyo, Japan

[21] Appl. No.: 19,570

[22] Filed: Feb. 18, 1993

[30] Foreign Application Priority Data

Feb. 19, 1992 [JP] Japan .................... 4-032250

[51] Int. Cl.⁶ .............................................. H03D 3/24
[52] U.S. Cl. ...................................... 375/376; 375/354;
  375/571; 331/25
[58] Field of Search ............... 375/120, 118, 81, 106;
  328/133, 155; 329/307; 331/1 A, 25

[56] References Cited

U.S. PATENT DOCUMENTS

| | | | |
|---|---|---|---|
| 3,778,723 | 12/1973 | Schaefer | 328/155 |
| 4,052,558 | 10/1977 | Patterson | 375/56 |
| 4,577,163 | 3/1986 | Culp | 328/155 |
| 4,791,378 | 12/1988 | Waltham | 328/155 |
| 4,855,683 | 8/1989 | Troudet et al. | 320/155 |
| 5,036,294 | 7/1991 | McCaslin | 375/120 |
| 5,182,761 | 1/1993 | Beyer et al. | 375/81 |
| 5,272,730 | 12/1993 | Clark | 375/81 |

*Primary Examiner*—Stephen Chin
*Assistant Examiner*—T. Ghebretinsae
*Attorney, Agent, or Firm*—Jay H. Maioli

[57] ABSTRACT

The present invention is directed to a digital PLL (phase locked loop) circuit. A phase of an output clock is advanced by about 360° at every master clock. Only when there is a data edge having a large input level, a phase difference is calculated and the output clock frequency becomes a frequency deviated amount. Therefore, an electric power consumption can be reduced and an AGC (automatic gain control) function is presented in the input data. Further, the digital PLL circuit can be given free running control and leakage secondary PLL characteristics so that the digital PLL circuit can be enhanced in efficiency. Therefore, there is provided the clock reproducing digital PLL circuit of high efficiency which can reduce an electric power consumption.

7 Claims, 8 Drawing Sheets

DIGITAL PLL CIRCUIT WITH LOW POWER CONSUMPTION

BACKGROUND OF THE INVENTION

1. Field of the Invention

The present invention relates generally to PLL (phase locked loop) circuits and, more particularly, to a digital signal processing-type PLL circuit for extracting a clock from input digital data.

2. Description of the Prior Art

In the case of recording and reproducing apparatus that can record and reproduce digital data such as a digital audio signal or the like on and from a magnetic tape, in order to detect digital data reproduced from the magnetic tape upon playback, the reproduced signal is supplied to a PLL (phase locked loop) circuit and a clock contained in the reproduced data is extracted by the PLL circuit, whereby recorded data is detected in synchronism with the clock thus extracted.

The conventional PLL circuit that extracts the clock from the reproduced signal is formed of a circuit for performing analog processing. The analog PLL circuit must adjust a free running frequency in order to absorb irregular characteristics of circuit elements when it is assembled into a reproducing apparatus or the like. Also, the conventional analog PLL circuit has poor temperature characteristics and has an aging change. Further, the analog PLL circuit is quite easily affected by noise in the voltage-controlled oscillator (VCO) that constructs the PLL circuit. If an offset occurs in a phase of a reproduced clock due to the above-mentioned factors, then an error rate,of reproduced data will be deteriorated.

To remove such disadvantages, there has been developed a digital signal processing type PLL circuit (hereinafter simply referred to as a digital PLL circuit) that extracts a clock from an input signal in a digital processing fashion. U.S. Pat. No. 4,855,683, for example, describes a circuit arrangement of a digital PLL circuit having an accumulator type digital voltage controlled oscillator.

In the digital PLL circuit, a digital VCO (digital voltage-controlled oscillator), for example, is constructed by an accumulator and a phase of output data of the digital VCO formed of the accumulator and a phase of external input data are compared with each other by the calculation processing. Then, a compared result is fed back to the accumulator to thereby reproduce the clock of the external input data. According to this digital PLL circuit, a clock can be reproduced with high accuracy.

The digital PLL circuit, however, has the disadvantages such that its arrangement becomes complicated and that its electric power consumption is large.

More specifically, when the digital PLL circuit performs a digital signal processing, an analog-to-digital (A/D) converter for converting an input signal (reproduced signal) into a digital signal must be provided at the preceding stage of the digital PLL circuit. Also, digital conversion necessary for the processing in the digital PLL circuit needs high speed processing. Accordingly, a circuit scale and an electric power consumption necessary for the above conversion processing are unavoidably increased.

A master clock required by the digital PLL circuit must be made higher than a maximum frequency of an output clock in the reproduced signal, and a large electric power is required to prepare a master clock having a high frequency.

When digital data is detected from a reproduced signal reproduced from the magnetic tape, the level of the reproduced signal is considerably fluctuated due to the reproduced state (e.g., the tracking control state of the playback head) of the magnetic tape. Further, the level of reproduced signal is fluctuated when a sampling is carried out in the vicinity of a zero-cross point of reproduced data due to the change of sampling phase upon digital conversion of the reproduced data or when the sampling is carried out at other portions.

The processing within the digital PLL circuit needs a clock whose frequency is as high as some integer times the frequency of the output clock. There is then the disadvantage that a clock frequency of the system is limited. If a data transmission rate of an input signal (reproduced signal) to the digital PLL circuit is fluctuated such as when a reproducing speed of the magnetic tape is fluctuated, then a free running frequency is fluctuated relatively, thereby causing the error rate to be deteriorated.

Furthermore, when the clock frequency of the input signal to the digital PLL circuit is deviated from the free running frequency, there then occurs a stationary phase offset so that an offset corresponding to the deviated amount of the input frequency from the original frequency occurs in the phase of the reproduced clock. As a result, an error rate of the data is deteriorated.

OBJECTS AND SUMMARY OF THE INVENTION

Therefore, it is an object of the present invention to provide an improved digital PLL circuit in which the aforesaid shortcomings and disadvantages encountered with the prior art can be eliminated.

More specifically, it is an object of the present invention to provide a clock reproducing digital PLL circuit of high efficiency.

It is another object of the present invention to provide a clock reproducing digital PLL circuit which can reduce electric power consumption.

According to a first aspect of the present invention, there is provided a digital PLL circuit which comprises a circuit for comparing a phase of output data from a digital voltage-controlled oscillator formed of an accumulator and a phase of external input data, a circuit for feeding a compared result back to the accumulator to thereby reproduce a clock of the external input data, a circuit for detecting a polarity of the external input data, a circuit for detecting an absolute value of the level of sample data of the external input data, a circuit for adjusting a gain so that sample data having a large absolute value detected falls within a constant range, a circuit for adjusting a gain of the other sample data with the same ratio, a circuit for calculating a phase of input data on the basis of respective sample data thus gain-adjusted and a circuit for phase-comparing the input data with output data of the digital VCO.

According to a second aspect of the present invention, there is provided a digital PLL circuit which comprises a circuit for comparing a phase of output data from a digital voltage-controlled oscillator formed of an accumulator and a phase of external input data, a circuit for feeding a compared result back to the accumulator to thereby reproduce a clock of the external input data and a circuit for detecting an absolute value of the level of the external input data, wherein when the detected level is less than a predetermined level, a phase comparing processing is not carried out.

According to a third aspect of the present invention, there is provided a digital PLL circuit which comprises a circuit for comparing a phase of output data from a digital voltage-controlled oscillator formed of an accumulator and a phase of external input data, a circuit for feeding a compared result back to the accumulator to thereby reproduce a clock of the external input data and a circuit for detecting a polarity of the external input data, wherein when the polarity is not inverted, a phase comparing processing is not carried out.

According to a fourth aspect of the present invention, there is provided a digital PLL circuit which comprises a circuit for comparing a phase of output data from a digital voltage-controlled oscillator formed of an accumulator and a phase of external input data, a circuit for feeding a compared result back to the accumulator to thereby reproduce a clock of the external input data and a circuit for adding free running frequency data to the phase-compared data fed back to the accumulator.

In accordance with a fifth aspect of the present invention, there is provided a digital PLL circuit which comprises a circuit for comparing a phase of output data from a digital voltage-controlled oscillator formed of a first accumulator and a phase of external input data, a circuit for feeding compared phase difference data back to the first accumulator and a circuit for feeding the phase difference data accumulated in a second accumulator back to the first accumulator.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

A digital PLL circuit according to an embodiment of the present invention will hereinafter be described with reference to the accompanying drawings.

Figure 1:
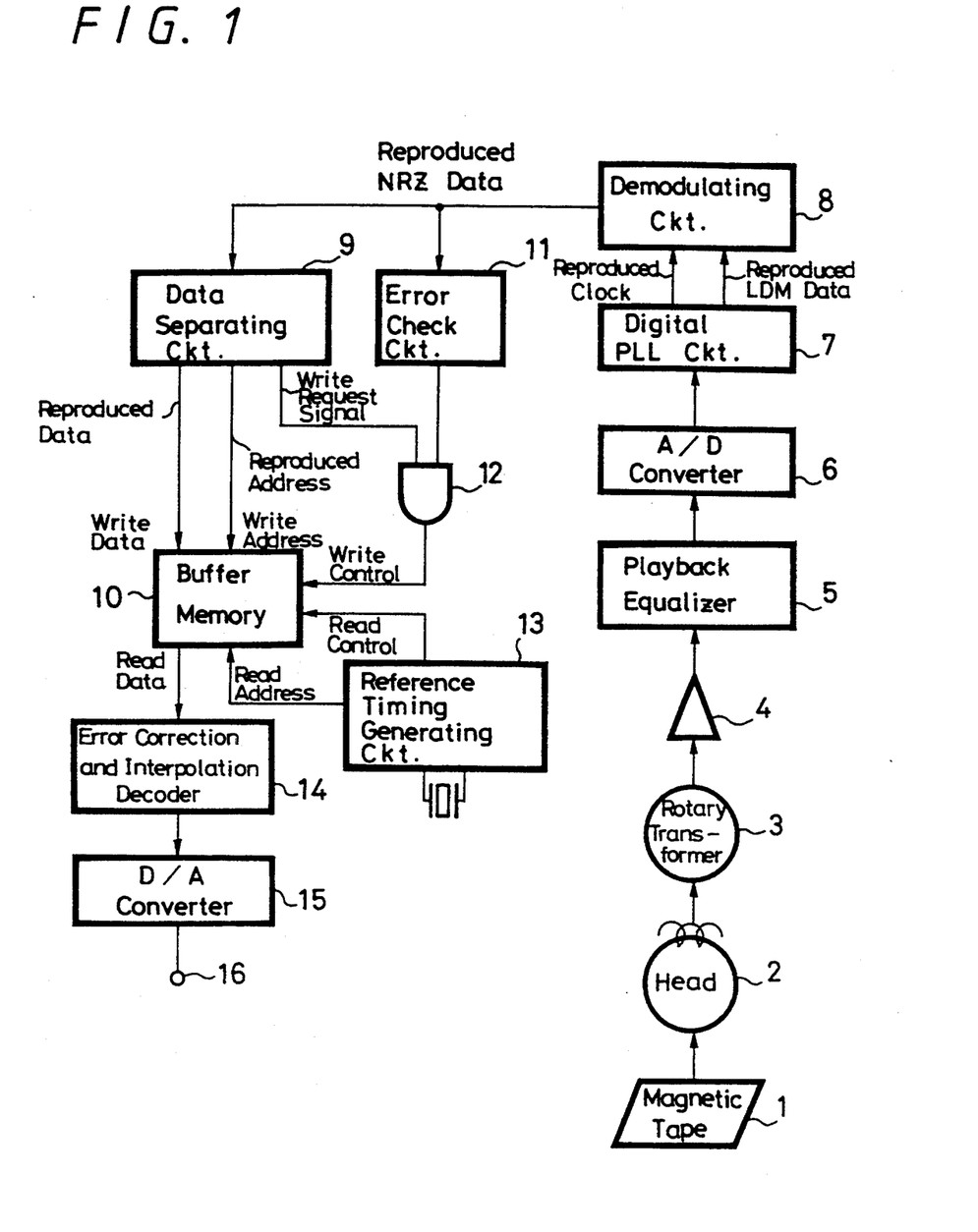
FIG. 1 is a block diagram showing a circuit arrangement of a reproducing apparatus to which an embodiment of the present invention is applied.

In this embodiment, the present invention is applied to a reproducing apparatus which reproduces a digital audio signal that is recorded on a magnetic tape according to a so-called non-tracking system that does not require accurate tracking. FIG. 1 shows in block form an overall circuit arrangement of the reproducing apparatus.

As shown in FIG. 1, there is provided a magnetic tape 1. Digital audio data is recorded on the magnetic tape 1 so as to sequentially form slant tracks on the magnetic tape 1. Recorded data on the magnetic tape 1 is reproduced by a rotary magnetic head 2 mounted on a rotary head drum (not shown). A reproduced signal is supplied through a rotary transformer 3 and a head amplifier 4 to a playback equalizer 5. The reproduced signal thus equalized by the playback equalizer 5 is supplied to an analog-to-digital (A/D) converter 6, in which it is converted into 8-bit digital data by the sampling operation synchronized with a master clock. Digital data from the A/D converter 6 is supplied to a digital PLL circuit 7. A circuit arrangement of the digital PLL circuit 7 will be described later on.

In this embodiment, a frequency of the master clock (sampling clock in the A/D converter 6) is selected to be substantially equal to a frequency of a clock component contained in a reproduced signal.

A clock is reproduced from the data supplied from the A/D converter 6 side by the digital PLL circuit 7. The reproduced clock and the data are supplied to a demodulating circuit 8 and the demodulating circuit 8 demodulates the data in synchronism with the reproduced clock. In this embodiment, the data recorded on the magnetic tape 1 is data that is modulated according to a predetermined modulation format. The reproduced data thus modulated is demodulated by the demodulating circuit 8 to provide an NRZ (non-return to zero) signal.

The reproduced NRZ data from the demodulating circuit 8 is supplied to a data separating circuit 9, in which it is separated into audio data and address data contained in the reproduced data. The audio data thus separated is supplied to and written in a buffer memory 10. In that case, a write address is controlled by the address data separated from the reproduced data. In order to control the writing operation, the reproduced NRZ data from the demodulating circuit 8 is supplied to an error check circuit 11 and the error check circuit 11 checks at every reproduced data of one unit the condition that an error occurs in the reproduced data. When the reproduced data is not erroneous (or the rate that an error will occur is less than a predetermined value), a write enable signal is supplied to an AND gate 12. Each time reproduced data of one unit is separated in the data separating circuit 9, a write request signal is supplied to the AND gate 12. When the write request signal and the write enable signal are supplied to the AND gate 12 at a coincident timing, a write control signal is supplied to the buffer memory 10. Only correctly-reproduced data is written in the buffer memory 10 at its area corresponding to the address.

The data written in the buffer memory 10 is read out therefrom in the sequential order of the addresses in synchronism with a reference clock supplied from a reference timing generating circuit 13. Audio data thus read out from the buffer memory 10 is supplied to an error correction and interpolation decoder 14, in which it is error-corrected and error-interpolated. The audio data thus processed is converted into an analog audio signal by a digital-to-analog (D/A) converter 15. The converted analog audio signal is supplied to an output terminal 16.

The reproduced data is temporarily written in the buffer memory 10 and then read out therefrom as described above. Therefore, even when the rotary magnetic head 2 is not tracked accurately to the tracks on the magnetic tape 1, by correctly controlling the write address to the buffer memory 10 and reading out the data from the buffer memory 10 in the sequential order of tracks, it is possible to obtain satisfactory reproduced data which is similar to data that can be obtained by the accurate tracking control. In addition, the reproduced data from the buffer memory 10 becomes data having a constant transmission rate synchronized with the reference clock from the reference timing generating circuit 13. Thus, satisfactory audio data can be obtained.

A circuit arrangement of the digital PLL circuit 7 of this embodiment which is applied to the aforesaid reproducing apparatus will be described with reference to FIG. 2.

Figure 2:
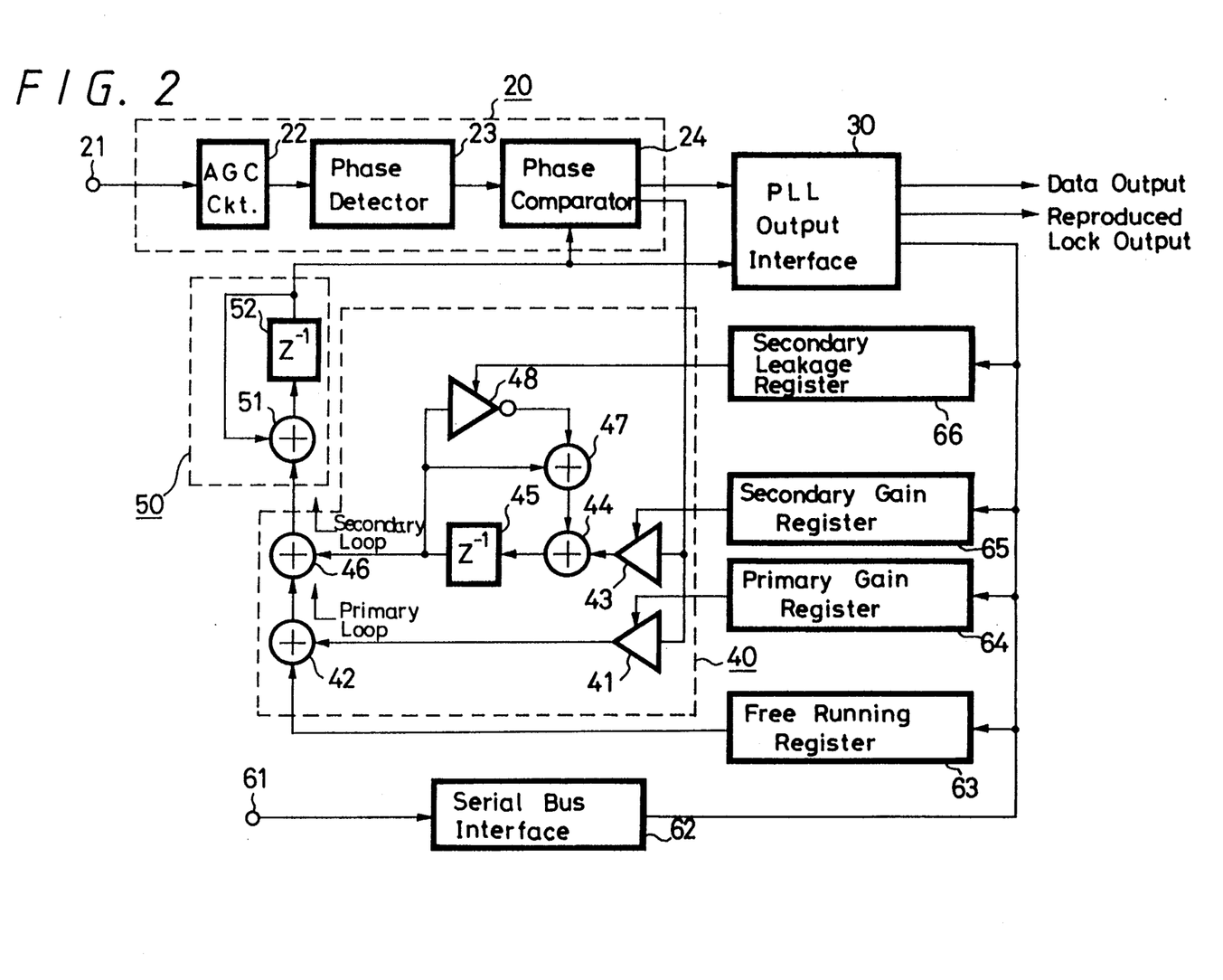
FIG. 2 is a block diagram showing a circuit arrangement of a digital PLL circuit according to the embodiment of the present invention.

As shown in FIG. 2, there is provided a phase comparing unit 20. The phase comparing unit 20 is adapted to compare a phase of data supplied to a terminal 21 from the circuit (A/D converter 6) of the preceding stage and a phase of output data of a digital VCO 50. More specifically, the 8-bit reproduced data from the A/D converter 6 is supplied through the terminal 21 to an automatic gain control (AGC) circuit 22. The reproduced data is adjusted in gain by the bit shift operation in the AGC circuit 22 in a digital fashion. Then, the reproduced data thus gain-adjusted is supplied to a phase detector 23 which detects a phase of an edge of a clock contained in the reproduced data. Phase data detected by the phase detector 23 is supplied to a phase comparator 24, in which it is compared with a phase of output data from the digital VCO 50.

Clock phase error data output on the basis of the compared result of the phase comparator 24 is supplied to a loop filter 40. Phase error data processed by the loop filter 40 is supplied to the digital VCO 50. An arrangement of the loop filter 40 will be described. The loop filter 40 of this embodiment comprises loops of two stages form of a primary loop and a secondary loop. In the primary loop, the phase error data from the phase comparator 24 is supplied to a primary gain adjusting multiplier 41. The multiplier 41 carries out the gain adjustment on the basis of gain setting data supplied from a primary gain register 64 which will be described later on. The phase error data gain-adjusted by the multiplier 41 is supplied to an adder 42. The adder 42 adds free running setting data supplied from a free running register 63, which will be described later on, to the phase error data supplied from the multiplier 41 side. The data thus added is supplied to an adder 46.

In the secondary loop, the phase error data from the phase comparator 24 is supplied to a secondary gain adjustment multiplier 43. The multiplier 43 carries out the gain adjustment based on gain setting data supplied thereto from a secondary gain register 65. Then, the phase error data thus gain-adjusted by the multiplier 43 is supplied to an adder 44. The adder 44 adds phase-integrated data to the phase error data supplied from the multiplier 43 side.

An added output from the adder 44 is supplied to a D-type flip-flop 45 and an integrated output of the D-type flip-flop 45 is supplied to the adder 46, in which the output of the primary loop and the output of the secondary loop are added. Also, the integrated output of the integrator 45 is supplied to an adder 47 and an integrated value leakage inverter 48. The integrated value leakage inverter 48 is controlled in leakage amount on the basis of leakage control data supplied from a secondary leakage register 66 which will be described later on. The phase integrated value directly supplied from the D-type flip-flop 45 and the leakage value supplied from the secondary leakage register 66 are added by the adder 47. A phase integrated value from which the leakage amount is subtracted is supplied to the adder 44 as the output of the adder 47. Then, the output of the adder 47 is added to the phase error data that is gain-adjusted by the adder 44.

The phase integration loop is constructed as described above. The output of the phase integration loop is supplied to the adder 46, in which it is added to the output of the primary loop supplied from the adder 42 side. The output of the adder 46 is supplied to the digital VCO 50 as the output of the loop filter 40.

Figure 3A:
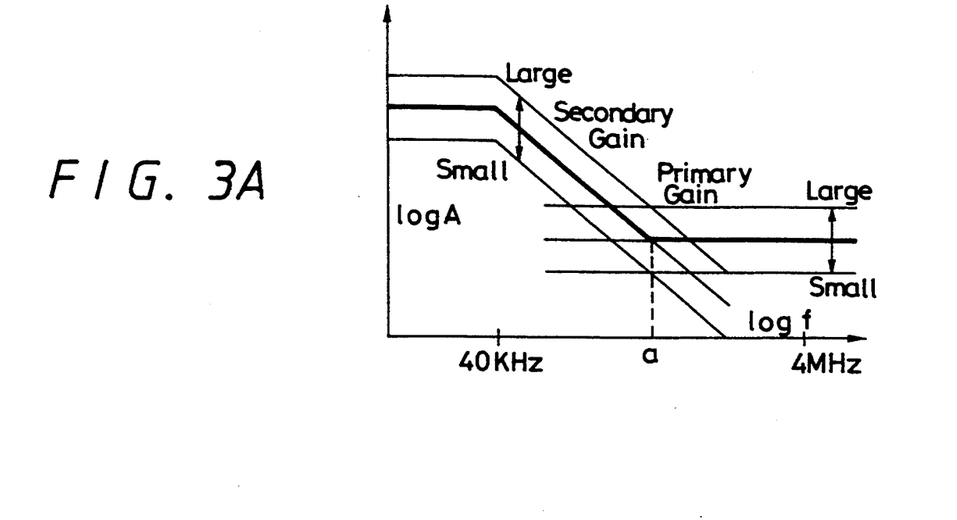
FIGS. 3A and 3B are characteristic graphs of frequencies of a loop filter according to the embodiment of the present invention, respectively.
Figure 3B:
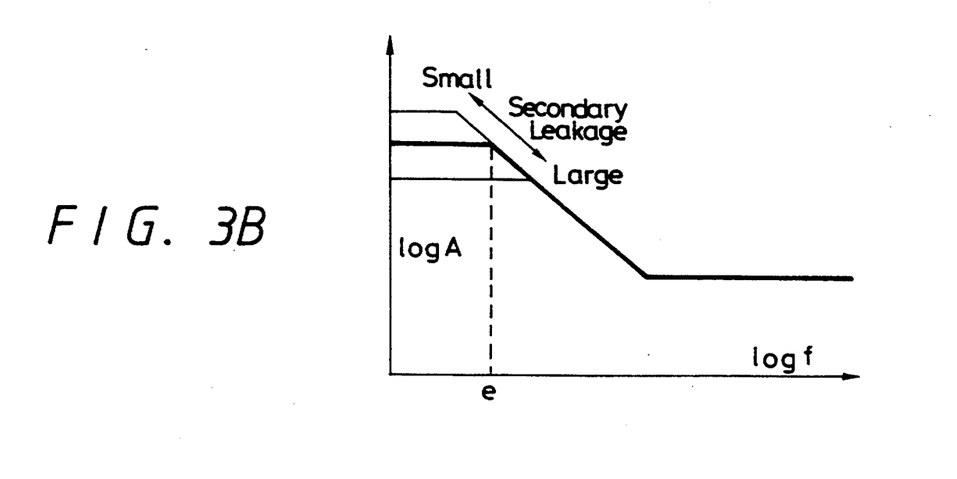

The loop filter 40 is constructed as described above and serves as a filter having frequency characteristics shown in FIGS. 3A and 3B. Since the digital VCO 50, which will be described later on, itself carries out the primary integration, the digital PLL circuit has a secondary PLL characteristic. The secondary loop of the loop filter 40 serves to reduce the stationary phase error to zero at its portion (loop fed from the D-type flip-flop 45 through the adders 47, 44 back to the D-type flip-flop 45) which integrates the phase error. The secondary loop includes an integration leakage path formed of the integrated value leakage inverter 48, whereby a DC gain is limited. If there is no integration leakage path, when the locking of the PLL circuit is disabled, or when no data is input, the value of the secondary loop at that time is maintained or drifts randomly, thereby hindering the PLL circuit from being locked to a new input. As a result, a pull-in time of the PLL circuit is increased.

When there is provided the integration leakage path as described above, the above frequency characteristic returns to the free running frequency naturally. Also, the integration leakage path can improve excess response to a step response, which can be understood from the standpoint of a damping factor of the secondary feedback system. That is, the integration leakage path of the secondary loop determines a cut-off frequency shown by e in FIG. 3B. A gain control of secondary loop determines a cut-off frequency a in FIG. 3A. FIG. 3A shows examples of frequencies and the gain control can be applied in a range of from about 4 MHz to 40 kHz, for example. A damping factor $\zeta$ is expressed by the following equation (1):

$$\zeta = (K+e)/2\sqrt{(ak)} \quad (1)$$

where k is the one cycle loop gain. Accordingly, if a gain of the secondary loop is decreased by increasing the cut-off frequency e or by decreasing the cut-off frequency a, then ringing is suppressed and the secondary loop is approached to the primary system.

In this embodiment, the leakage path of the secondary loop is realized by leaking data stored in the secondary loop by $\frac{1}{8}$ each $mf_s/256$ times (m is the integer from 1 to 16 and $f_s$ is the master clock frequency and sampling frequency) per second.

The digital VCO 50 to which the output of the loop filter 40 is supplied is formed as an accumulator. As shown in FIG. 2, the output of the loop filter 40 is supplied to an adder 51 and an added output of the adder 51 is supplied to a D-type flip-flop 52. An output of the D-type flip-flop 52 is supplied to the adder 51, in which it is added to the output of the loop filter 40. Also, the output of the D-type flip-flop 52 is supplied to the phase comparator 24 and an PLL output interface 30 as the output of the digital VCO 50. In this case, the output of the digital VCO 50 is output as an instantaneous phase clock.

Figure 4A:
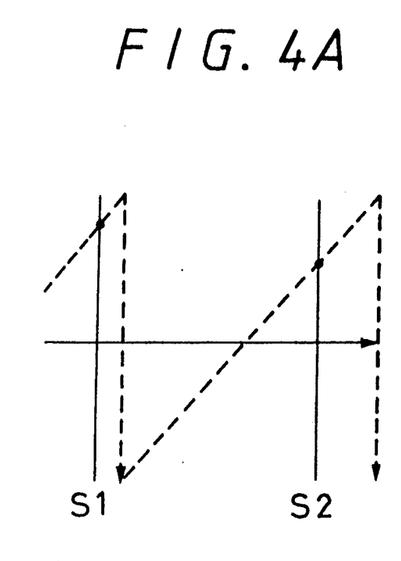
FIGS. 4A through 4C are waveform diagrams showing output states of the digital VCO according to the embodiment of the present invention, respectively.
Figure 4B:
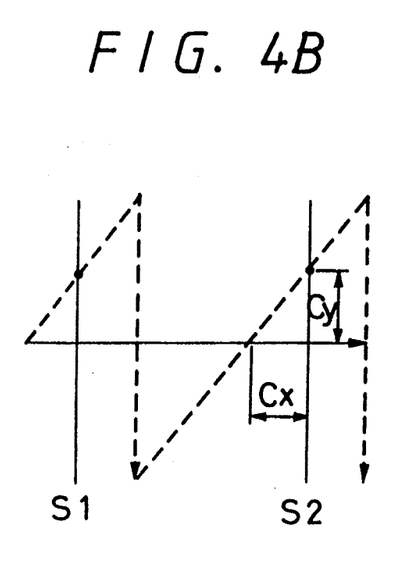
Figure 4C:
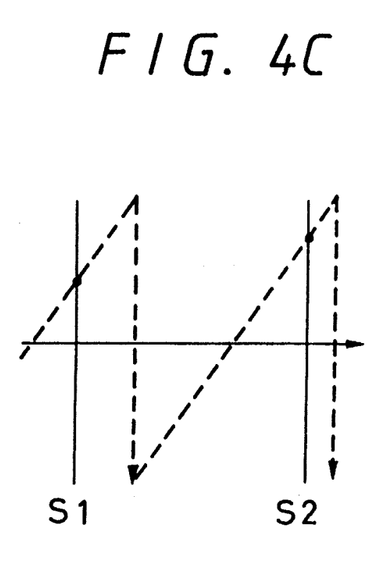

The output states of the digital VCO 50 will be described with reference to FIGS. 4A through 4C. In this embodiment, an 8-bit frequency input to the PLL circuit is integrated by a loop accumulator of the digital VCO 50, thereby producing 8 bits of clock instantaneous phase output. As the input to the digital VCO 50, there can be employed an added value of the output of primary loop from the loop filter 40 side, the output of the secondary loop and the free running setting data.

The output clock of the digital VCO 50 is illustrated in the state of sampling points by the master clock (the same as the sampling clock in the A/D converter 6) where the phase is ±180°. In this embodiment, since the frequency of the master clock and the output frequency of the digital VCO 50 are made substantially equal to each other, it is considered that the phase is advanced by about 360° per sample. FIGS. 4A, 4B and 4C show states in certain consecutive two sampling points S1 and S2, respectively. FIG. 4A shows the condition that the output frequency of the VCO 50 is lower than the frequency of the master clock. FIG. 4B shows the condition that the output frequency of the VCO 50 is equal to the frequency of the master clock. FIG. 4C shows the condition that the output frequency of the VCO 50 is higher than the frequency of the master clock. Solid circles shown on respective sampling points represent sampling levels. In actual practice, levels shown by broken lines except these sampling points are changed in an analog fashion and arrows of downward broken lines represent clock edges, respectively.

Under this condition, assuming that the zero-cross points of upward broken lines represent times of phase angle 0° and that a displacement of the zero-cross point of the output of the VCO 50 relative to the sampling point is defined by an instantaneous phase Cx, then the instantaneous phase of the output of the VCO 50 can be obtained from the amplitude direction of the output of the VCO 50. That is, if 360° is taken as 1 and the phase angle ±180° is taken as ±0.5, then a level value Cy in the amplitude direction can be approximately replaced with the instantaneous phase Cx. That is, Cy=Cx can be established.

The free running setting data is supplied to the digital VCO 50, whereby a free running frequency deviation can be set from the outside. More specifically, when a deviation between the mean frequency of the VCO output and the master clock frequency is known, if the free running frequency is matched with the mean frequency of the VCO output by the free running setting data supplied thereto from the controller side of the PLL circuit, then a lock characteristic of the PLL circuit can be improved. A free running adjusting range of the VCO 50 in this embodiment will be described with reference to the equation. If the frequency of the master clock is taken as $f_s$, a virtual output frequency of the VCO 50 is taken as $f_0$, free running setting data is taken as $\alpha$ and the output clock of the VCO and the free running setting data are taken as 8-bit data, respectively, the virtual output frequency $f_0$ is expressed by the following equation (2):

$$f_0=(1+\alpha/256)f_s \qquad (2)$$

If the condition of the free running setting data $\alpha$ is selected to be $-32 \leq \alpha \leq 31$, then the free running adjustment range becomes about ±12.5%.

In the phase comparator 24 which is supplied with the thus obtained output of the VCO 50, the phase of the input data and the output phase of the digital VCO 50 are compared with each other. Data concerning the advance/delay of the data phase is supplied from the phase comparator 24 to the PLL output interface 30. Then, the PLL output interface 30 reproduces a clock on the basis of the output of the digital VCO 50 and the data concerning the advance/delay of the data phase. A reproduced clock and the data are supplied to the circuit (demodulating circuit 8) of the succeeding stage.

In FIG. 2, reference numeral 61 depicts a terminal to which there is supplied control data from a controller (not shown) of this PLL circuit. The control data obtained at the terminal 61 is supplied to a serial bus interface 62. Then, various data from the serial bus interface 62 are supplied to a corresponding circuit of the free running register 63, the primary gain register 64, the secondary gain register 65, the secondary leakage register 66 and the PLL output interface 30.

Figure 5:
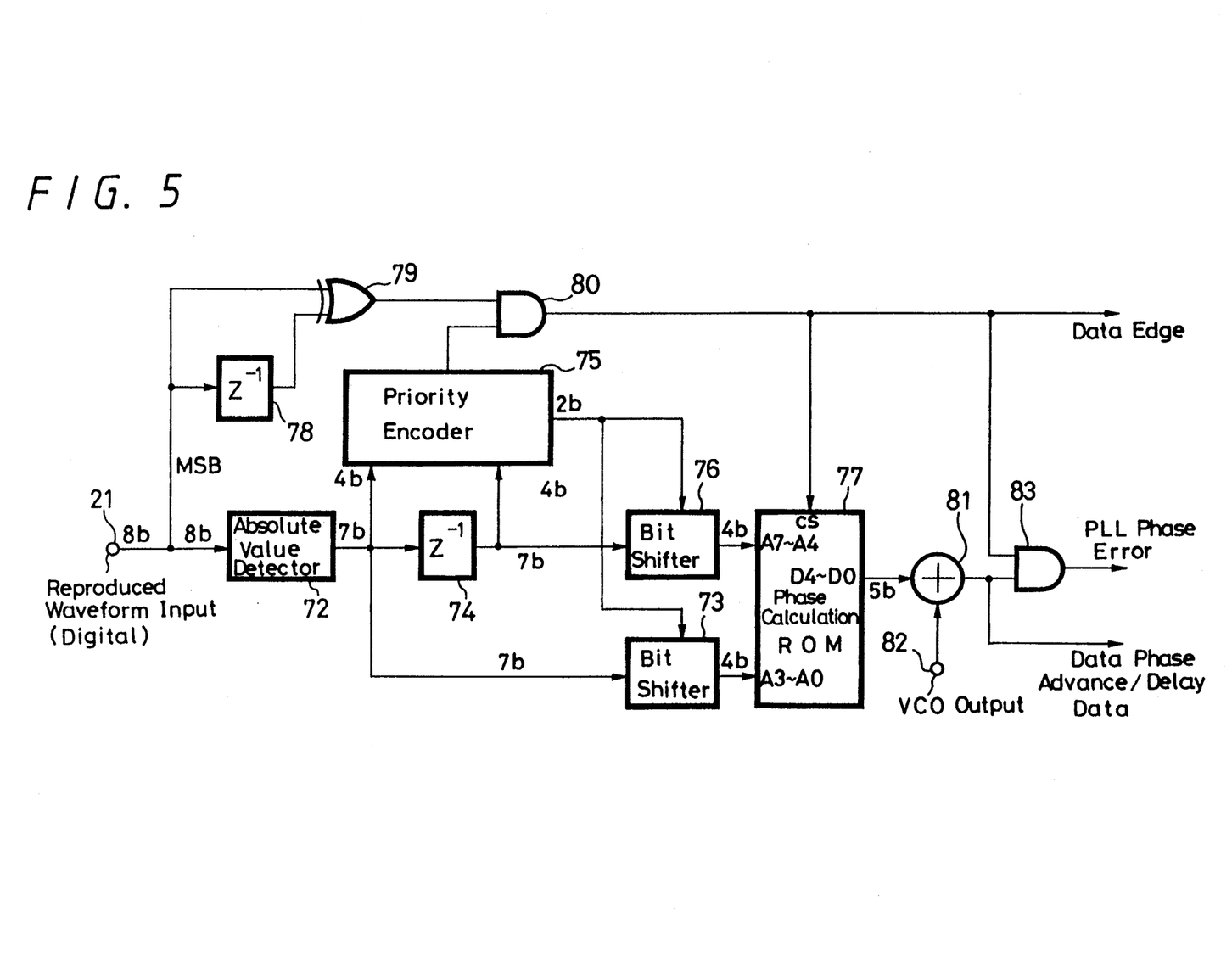
FIG. 5 is a block diagram showing a circuit arrangement of a phase comparing unit of the digital PLL circuit according to the embodiment of the present invention.

FIG. 5 shows a circuit arrangement of the phase comparing unit 20 in the digital PLL circuit of this embodiment.

As shown in FIG. 5, the 8-bit digital data from the A/D converter 6 is supplied through the terminal 21 to an absolute value detecting circuit 72. The absolute value detecting circuit 72 converts the 8-bit digital data into 7-bit absolute value data excepting the most significant bit. The 7-bit data is supplied to a first bit shifter 73 and an integrator 74. High-order 4-bit data of 7-bit data from the absolute value detecting circuit 72 is supplied to a priority encoder 75 as data representative of present sampling points. The integrator 74 outputs 7-bit data of one sample before, that is, data of the preceding sample. The 7-bit data of one sample before is supplied to a second bit shifter 76 and high-order 4-bit data of the 7-bit data of one sample before is supplied to the priority encoder 75.

The priority encoder 75 performs the judgement on the basis of the high-order 4-bit data of the present sampling points and the high-order 4-bit data of one sample before and outputs a judged result as 2-bit data. The 2-bit data provided as the judged result is supplied to the first and second bit shifters 73 and 76. In the respective bit shifters 73 and 76, the same bit shift amount is set by the 2-bit data supplied thereto from the priority encoder 75 and the gain adjustment is carried out by the bit shift. Data, gain-adjusted by the first and second bit shifters 73 and 76, are supplied to a phase-calculating ROM (read-only memory) 77.

The judging state of the priority encoder 75 will be described. The priority encoder 74 judges the levels of four stages on the basis of data of large level of the high-order 4-bit data at each sample point and forms 2-bit data on the basis of the levels of four stages thus judged. Then, on the basis of the 2-bit data output from the priority encoder 75, each of the bit shifters 73, 76 selects one of the bit shift amounts of four stages. More specifically, if the respective bits of 7-bit data supplied to each of the bit shifters 73, 76 are taken as [b6, b5, b4, b3, b2, b1, b0] in the sequential order of high-order bit, then when the maximum level within the four stages is detected, each of the bit shifters 73 and 76 selects the high-order 4 bits [b6, b5, b4, b3] so as to provide a minimum gain. Then, each time the detection level is lowered by one stage, output data is shifted by one bit. Thus, when the level of the minimum stage is detected, each of the bit shifters 73, 76 selects low-order 4 bits [b3, b2, b1, b0] so as to provide a maximum gain.

The priority encoder 75 of this embodiment has a large level judging data output. The large level judging data output outputs "1" level data when "1" level data exists in high-order 4-bit data of each sampling point supplied thereto, and outputs "0" level data when the high-order 4-bit data of each sample point supplied thereto is all "0" level data.

The most significant bit MSB of the 8-bit digital data obtained at the terminal 21 is supplied to a D-type flip-flop 78 and an exclusive-OR gate 79, and an output of the D-type flip-flop 78 is supplied to the exclusive-OR gate 79. The exclusive-OR gate 79 compares the most significant bit data of the present sample point directly supplied thereto from the terminal 21 and the most significant bit data of one sample before supplied thereto from the D-type flip-flop 78. When both the most significant bits are different, the exclusive-OR gate 79 judges that the polarity of data is inverted and then outputs "1" level data. An output of the exclusive-OR gate 79 is supplied to an AND gate 80 as polarity inverting data.

Also, the large level judging data output from the priority encoder 75 is supplied to the AND gate 80 and the AND gate 80 calculates a logical product of the large level judging data and the polarity inverting data. Then, the logical product of both data is employed as data edge detecting data.

Then, the data edge detecting data is supplied to a chip select input CS of the phase calculation ROM 77. The phase calculation ROM 77 calculates the phase on the basis of 4-bit data representing the current sampling point and the sampling point of one sample before that are gain-adjusted by the respective bit shifters 73 and 76. Zero-cross phase calculated values corresponding to the 4-bit data of the respective sample points are written in the ROM 77 in advance. In that case, since the 4-bit data are compared with each other, $2^4 \times 2^4 = 16^2 = 256$ is established and there are 256 different zero-cross phase calculated values. The 256 different zero-cross phase calculated values are written in the phase calculation ROM 77 as 256 words, and corresponding words are selected from 256 words in response to the outputs of the respective bit shifters 73 and 76. Each of the zero-cross phase calculated values of the 256 words is written in the phase calculation ROM 77 as 5-bit data.

Figure 6:
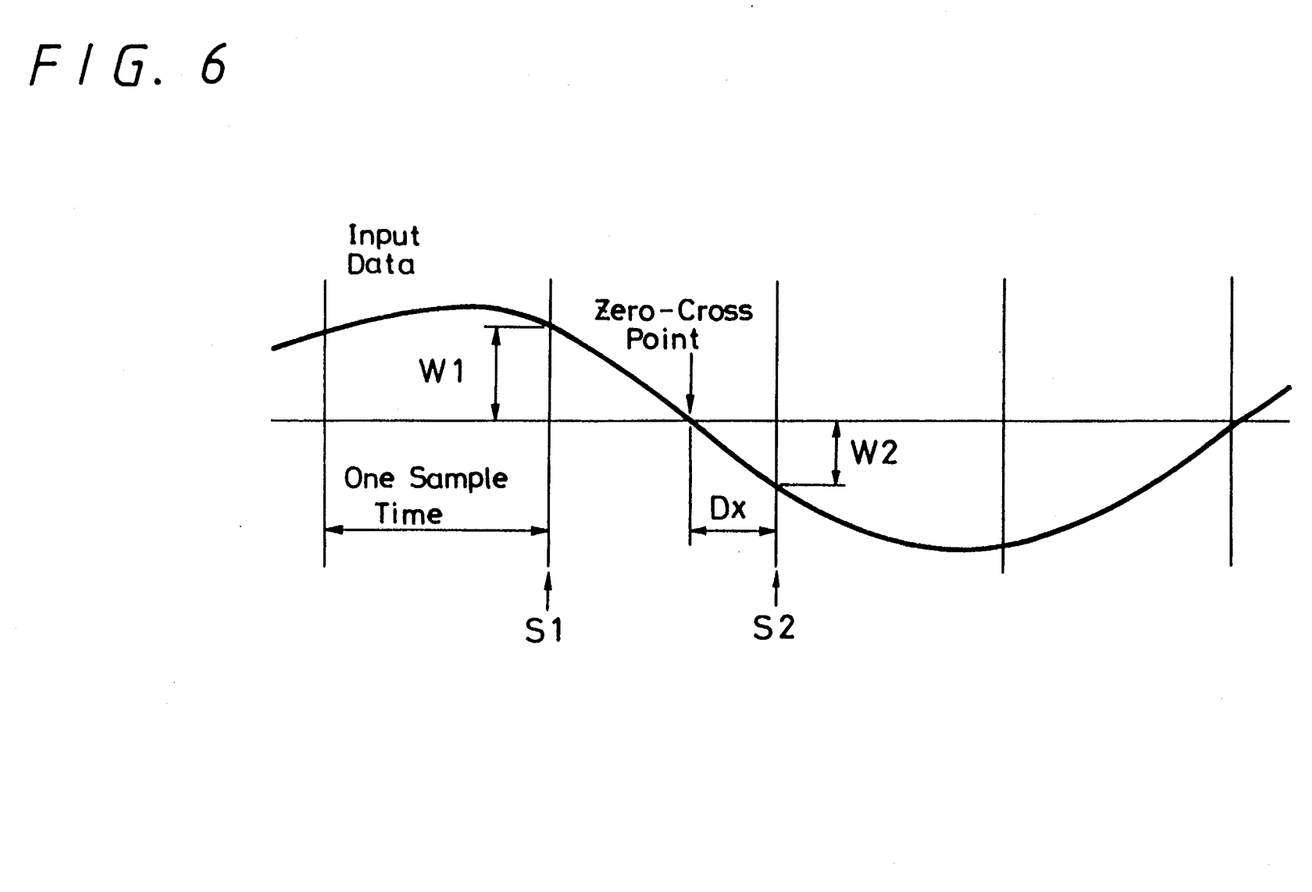
FIG. 6 is a waveform diagram showing a data edge detecting state according to the embodiment of the present invention.

The phase calculation condition in the phase calculation ROM 77 will be described below. FIG. 6 is a diagram showing the condition of zero-cross phase Dx of input data relative to the sampling points. The zero-cross phase Dx can be approximately obtained by a sampling point (current sampling point) S2 that is behind the zero-cross point and a sampling point (past sampling point) S1 that is ahead of the zero-cross point. That is, the zero-cross phase Dx can be obtained by calculating amplitudes W1, W2 of the two sampling points S1, S2 in a linear approximation fashion by the following equation (3):

$$Dx = W2/(W1+W2) \quad (3)$$

According to this embodiment, the data edge detecting data is supplied to the chip select input CS of the phase calculation ROM 77 as described above, whereby the zero-cross phase is calculated on the basis of the above equation (3) only when the data edge is detected. Inasmuch as the "1" level data is not supplied to the chip select input CS of the phase calculation ROM 77, the phase calculation ROM 77 is not operated. Only when the data edge is detected, is the phase calculation ROM 77 operated.

The 5-bit data of the word selected by the zero-cross phase calculation in the phase calculation ROM 77 is supplied to an adder 81 as data of data edge phase. The output data from the digital VC0 50 is supplied through a terminal 82 to the adder 81, in which the phases of the data of data edge phase and the output data of the digital VCO 50 are compared with each other by the addition processing. Data concerning advance/delay of data phase can be obtained by the above phase comparison and the data concerning the advance/delay of data phase is supplied to the PLL output interface 30. Also, the data phase advance/delay data is supplied to an AND gate 83 and the AND gate 83 calculates a logical product of the data phase advance/delay data and the data edge detecting data. Then, the logical product data is supplied to the loop filter 40 as phase error data of the reproduced clock. Further, the data edge detecting data is supplied to the PLL output interface 30.

The phase comparing condition in the circuits facing the adder 81 will be described below. The instantaneous phase data Cx supplied from the digital VCO 50 side is a substituted value of the level value Cy in the amplitude direction. At that time, if the phase of the current sampling point is selected to be 0°, the point of one sample before has a phase of 360°. The phase error can be obtained by subtracting the output instantaneous phase data Cx of the digital VCO 50 from the zero-cross phase data Dc output from the phase calculation ROM 77. If the phase error data thus obtained by the above subtraction is fed back to the digital VCO 50, then this circuit is operated as the PLL circuit.

The phase comparator of this embodiment needs two functions which will be described below:

(1) A phase difference between the phase of input data edge and the zero-cross point of the VCO output is calculated. The PLL circuit is constructed by obtaining the phase difference. The PLL circuit is controlled such that the data edge has a phase difference 0 relative to the clock in an average fashion. Therefore, the data edge can be locked to substantially an intermediate point between the clock edges; and (2) The clock edge phase of the VCO output and the data phase Dx are compared with each other to judge whether the data edge is ahead of or behind the clock edge. Thus, the data phase advance/delay data is generated, thereby determining a corresponding relation between the reproduced clock reproduced so as to be locked to the data and the data edge.

In order to realize the above two functions by one adder, the adder 81 is formed of a 5-bit full adder. The most significant bit MSB of the output of the digital VCO 50 is inverted and subtracted from the input edge phase by the adder 81 to thereby perform the comparison. Further, the most significant bit of the subtracted result is inverted by the AND gate 83 and a phase difference between the input data edge and the VCO output edge is calculated. Inverting the most significant bit MSB of the VCO output defines the phase of the VCO output by the timing of the edge.

The data phase advance/delay data is calculated on the basis of a phase difference between the data edge and the clock edge, and the output of the adder 81 is directly supplied to the PLL output interface 30. The phase compared result represented by the data phase advance/delay data falls within a range of ±360° relative to the clock edge.

The PLL output interface 30 will be described next. The PLL output interface 30 is adapted to obtain a data output synchronized with the master clock on the basis of the phase-compared result of the output from the VCO 50.

An output of the reproduced clock at the PLL output interface 30 will be described. Since the output of the VCO 50 and the master clock have substantially the same frequencies, it is frequently observed that the output frequency Of the VCO 50 becomes higher than the master clock frequency instantaneously. Therefore, as the reproduced clock data, two slots must be prepared in one clock cycle of the master clock. The two slots will be referred to as a preceding clock and a succeeding clock, respectively.

When the reproduced clock data at the two slots are discriminated, there can be considered six patterns shown in FIGS. 7A through 7F. FIGS. 7A through 7F are diagrams showing judged states of the clock between the past sampling point S1 and the current sampling point S2. In FIGS. 7A through 7F, sawtooth waveforms represent clock waveforms and a range of level represented by reference numerals of 2 bits on the left-hand side represent a range corresponding to the high-order 2 bits of the amplitude data of the clock waveform.

Figure 7A:
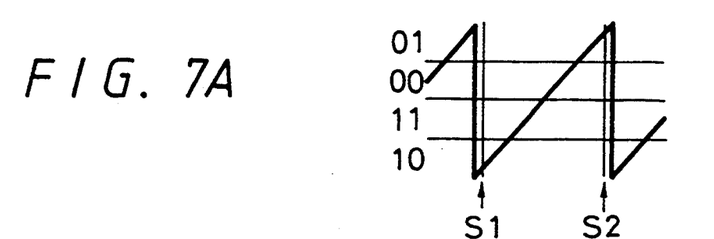
FIGS. 7A through 7F are waveform diagrams showing clock output judging states of a PLL output interface according to the embodiment of the present invention, respectively.

FIG. 7A shows the case that the reproduced clock has front and rear edges. At that time, in the sampling points S1 and S2, the high-order 2 bits are changed from [10] to [01]. In that case, the frequency of the reproduced clock is lower than that of the master clock.

Figure 7B:
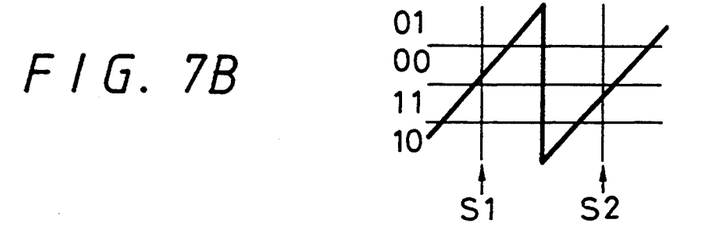
Figure 7C:
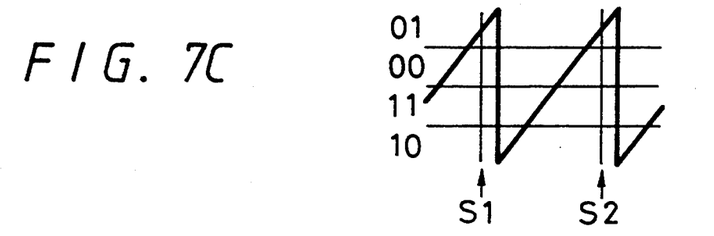

FIGS. 7B and 7C show the case that the reproduced clock has a front edge. At that time, in the sampling points S1 and S2, the high-order 2 bits are changed from [00] to [11] (in the case of FIG. 7B) or changed from [01] to [01] (in the case of FIG. 7C). In that case, under the state shown in FIG. 7B, the frequency of the reproduced clock is lower than that of the master clock. Under the state shown in FIG. 7C, a corresponding relation between the frequency of the reproduced clock and that of the master clock cannot be specified.

Figure 7D:
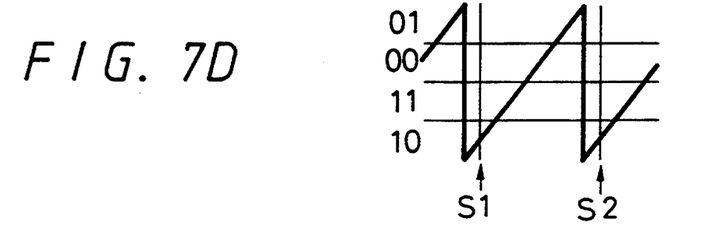
Figure 7E:
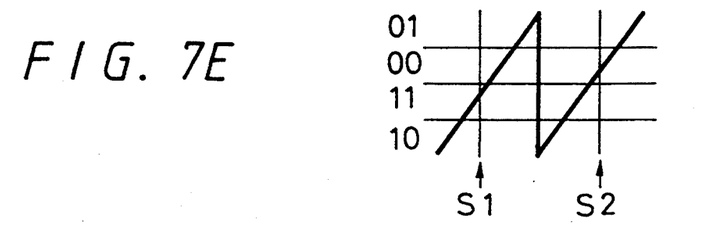

FIGS. 7D and 7E show the case that the reproduced clock has a rear edge. At that time, in the sampling points S1 and S2, the high-order 2 bits are changed from [10] to [10] (in the case of FIG. 7D) or changed from [11] to [00] (in the case of FIG. 7E). In that case, under the condition shown in FIG. 7D, a corresponding relation between the frequency of the reproduced clock and that of the master clock cannot be specified. Under the condition shown in FIG. 7E, the frequency of the reproduced clock is higher than that of the master clock.

Figure 7F:
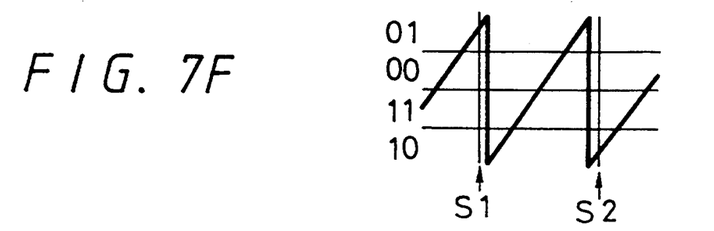

FIG. 7F shows the case that the reproduced clock has both the front and rear edges. At that time, in the sampling points S1 and S2, the high-order 2 bits are changed from [01] to [10]. In that case, the frequency of the reproduced clock is higher than that of the master clock.

In this way, the existence of the preceding clock and the succeeding clock can be judged by judging the high-order 2 bits. According to this embodiment, the data that judges the existence of the preceding clock and the succeeding clock is calculated with the clock having a frequency twice as high as that of the master clock in a logical product fashion and then output. Alternatively, such data is output in a base band transmission fashion as it is during the high level period and low level period of the master clock. When the aforesaid data is calculated with the clock having the frequency twice as high as that of the master clock in a logical product fashion and then output, it is output in the low speed mode. When the above data is output during the high level period and low level period of the master clock, the high speed mode is presented. In the case of high speed mode, the above data is constantly held at opposite polarity during the high level period of the master clock.

If the high speed mode is prepared as described above, then when the output of the VC0 and the master clock have substantially the same frequencies (i.e., when the digital PLL circuit is arranged according to this embodiment), the digital PLL circuit can be operated only by a difference frequency. Also, as an output of the low speed mode, there is obtained a similar output pulse to that of the analog PLL circuit. When the output of the low speed mode is selected, the circuit of the succeeding stage can be constructed similarly to that of the conventional analog PLL circuit.

Figure 8A:
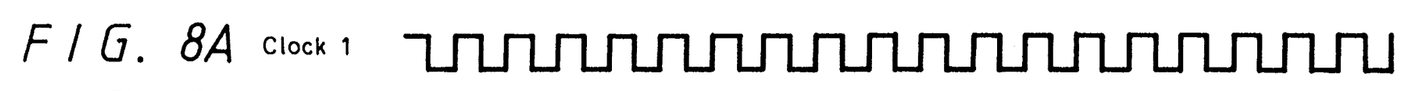
FIGS. 8A through 8H are waveform diagrams used to explain the embodiment of the present invention, respectively.
Figure 8B:
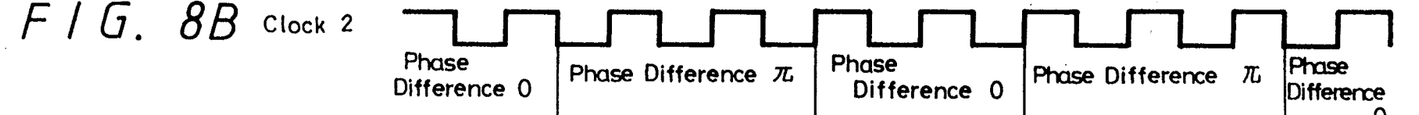
Figure 8C:
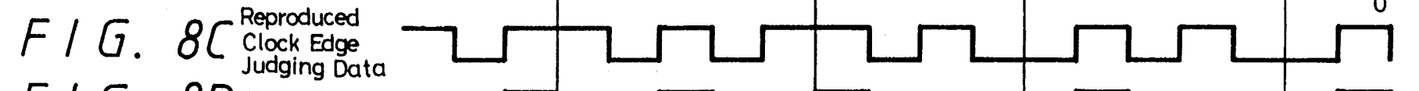
Figure 8D:
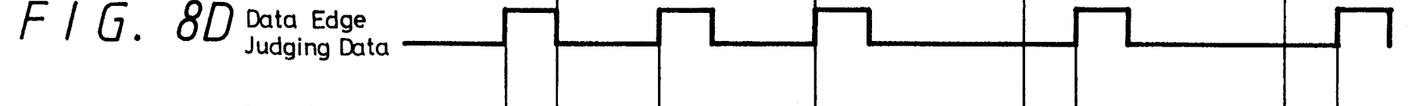

FIGS. 8A through 8H show examples of input and output at the PLL output interface 30. A clock 1 shown in FIG. 8A is a clock that has a frequency twice as high as that of the master clock. A clock 2 in FIG. 8B is a clock that has the same frequency as that of the master clock. Let it be assumed that there is obtained reproduced clock edge judging data (FIG. 8C) and that there is obtained data edge judging data (FIG. 8D). The high level period of each of the respective judging data represents a period of the clock and the data edge and the low level period thereof represents a period in which there are no clock and data edge.

Figures 8E, 8F:
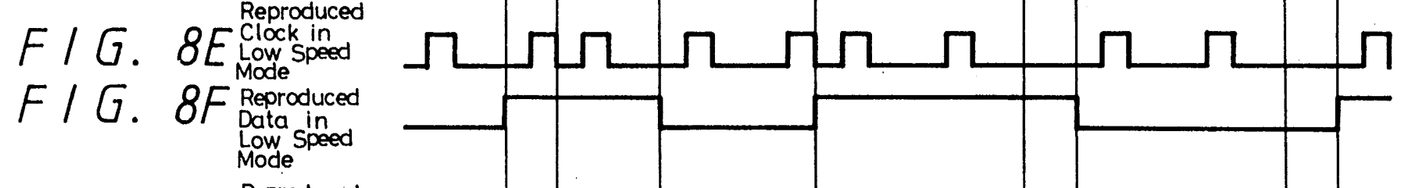

The output state in the low speed mode will be described. Data which results from inverting the clock 1 having the frequency twice as high as that of the master clock and the judged data of the reproduced clock are calculated in a logical product fashion. Then, a logical product output is employed as a reproduced clock (FIG. 8E) in the low speed mode. Reproduced data (FIG. 8F) in the low speed mode is data that is inverted in response to the leading edge of the data edge judging data. The reproduced data is obtained such that data edge judging data (FIG. 8D), for example, is supplied to the D-type flip-flop and an output level is changed each time the high level signal is input to the D-type flip-flop.

Figure 8G:
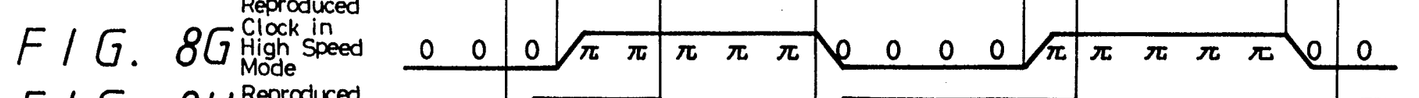
Figure 8H:
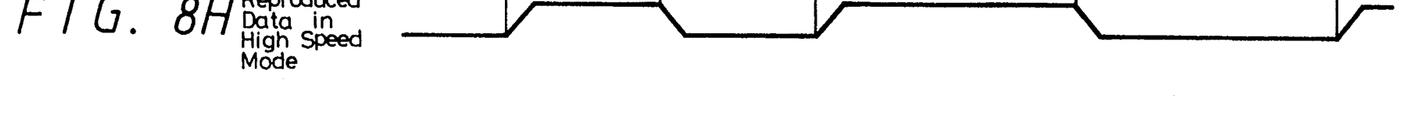

The output state in the high speed mode will be described. In this case, the master clock (clock 2) and the edge judging data (FIG. 8C) of the reproduced clock are calculated in an exclusive OR fashion. An exclusive-OR output is employed as a reproduced clock (FIG. 8G) in the high speed mode. The reproduced clock in the high speed mode is determined on the basis of a phase difference between the master clock and the judging data of the reproduced clock. That is, the level of the reproduced clock is determined on the basis of the phase difference of $\pi$ or 0. Reproduced data (FIG. 8H) in the high speed mode also is data which is inverted in response to the leading edge of the data edge judging data.

While the digital PLL circuit of this embodiment is applied to the digital audio data reproducing apparatus as described above, the digital PLL circuit is not limited thereto and may be applied to other digital data detecting apparatus. By way of example, the digital PLL circuit may be applied to clock reproducing means of a reproducing apparatus that reproduces recorded data from a disc on which digital data is recorded. Further, the digital PLL circuit of the present invention is not limited to the reproducing apparatus that reproduces digital data from a recording medium and may be applied to clock reproducing apparatus of a data detecting apparatus that receives and detects data transmitted thereto according to the wireless or wire system.

According to the present invention, the polarity of the external input data is detected and the absolute value of the level of the sample data of the external input data that is ahead of or behind the timing at which the detected polarity is inverted is detected. Then, the gain is adjusted such that sample data having a large detected absolute value falls within a constant range, and the other sample data is adjusted in gain with the same ratio. Input data is calculated in phase on the basis of the respective sample data thus gain-adjusted and compared in phase with the output data of the digital VCO. Therefore, data that is calculated in phase can be satisfactorily gain-adjusted and the phase calculation processing can be effected by less calculation processing. Thus, the circuit scale for phase calculation processing and the electric power consumption can be reduced. In the case of the aforesaid embodiment, if the input data is gain-adjusted to be 4-bit data, then the phase calculation ROM having the capacity of 256 words can be employed sufficiently. Therefore, as compared with the case that the phase calculation of 7-bit data is carried out, the capacity of ROM can be reduced significantly.

Further, according to the present invention, the level of the external input data is detected and the phase comparing processing is not carried out when the detected level is less than the predetermined level. Accordingly, under the condition that the state of the external input data need not be phase-compared, the phase comparing processing is not carried out. Therefore, useless calculation processing is not carried out and the electric power consumption can be reduced. When the present invention is applied to the magnetic tape reproducing apparatus, for example, as described above, during the period in which the reproducing head is not scanning data recording tracks or under the condition that the reproducing apparatus is set in the search mode, data is not reproduced and the reproducing level is lowered. Therefore, the phase comparing processing is not carried out and the electric power consumption during this period can be reduced.

According to the present invention, the polarity of external input data is detected and the phase comparing processing is not carried out when the detected polarity is not inverted.

Accordingly, under the condition that the state of the external input data need not be phase-compared, the phase comparing processing is not carried out. Therefore, useless calculation processing is not carried out and the electric power consumption can be reduced. According to the aforesaid processing, it is customary that the polarity of digital data is inverted once per several samples (e.g., 2 to 6 samples). The average number that the polarity of digital data is inverted is about once per 3 samples (changed a little depending on the modulation systems), and the electric power consumption for the phase comparing processing can be reduced to about $\frac{1}{3}$.

According to the present invention, since the free running frequency data is added to the phase-compared data fed back to the accumulator, the phase offset error can be reduced, and the locking capability of the PLL circuit can be enhanced, which can reduce the error rate. Further, according to the aforesaid arrangement, the frequency of the reproduced clock need not be selected to be an integral multiple of that of the master clock and the selection of the frequency of the master clock is not restricted, which enables the user to design the system with flexibility. Therefore, the frequency of the master clock can be made common to other apparatus, whereby the digital PLL circuit can be made common to other apparatus.

Furthermore, according to the present invention, there are provided a first accumulator and a second accumulator. The accumulated data in the second accumulator is fed back to the first accumulator to realize a secondary PLL function. Therefore, the feedback gain in the low frequency band can be increased and even a very small phase error can be corrected, thereby suppressing the low frequency from fluctuations. Thus, when the present invention is applied to the reproducing apparatus that reproduces the magnetic tape on which digital data is recorded, even if the transport of the magnetic tape upon playback is not constant due to the fluctuation of low frequency and the fluctuation of low frequency is contained in the reproduced data, such fluctuation can be absorbed on the PLL circuit side and the servo gain of the tape transport system can be lowered.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A digital phase comparing circuit for a digital phase locked loop circuit of the kind having an accumulator type digital voltage controlled oscillator for comparing a phase of output data from said accumulator type digital voltage controlled oscillator and a phase of input data in which an output of the digital phase comparing circuit is fed back to an accumulator provided within said accumulator type digital voltage controlled oscillator, comprising:

input data polarity detecting means for detecting whether a polarity of the input data is inverted from one sample of input data relative to a preceding sample of input data;

absolute value detecting means for detecting an absolute value of all samples of said input data fed to said input data polarity detecting means;

delay means connected to said absolute value detecting means for producing an output corresponding to the samples of said input data having an absolute value detected by said absolute value detecting means delayed by one sample;

priority encoder means for comparing each sample of input data output by said absolute value detecting means and each delayed sample of input data output by said delay means and for producing an output representing a result of the comparing operation;

gain adjusting means for adjusting a respective gain of each sample of input data output by said absolute value detecting means and each delayed sample of input data from said signal delay means in response to the output from said priority encoder means; and input data phase calculating means for calculating the phase of input data on the basis of respective input data gain-adjusted by said gain adjusting means.

2. The digital phase Comparing circuit according to claim 1, wherein a phase calculation of said phase calculating means is inhibited when the absolute value detected by said absolute value detecting means is less than a predetermined level.

3. The digital phase comparing circuit according to claim 1, wherein a phase calculation of said phase calculating means is inhibited when a polarity inversion of said input data is not detected by said polarity detecting means that detects a polarity of input data.

4. A method of digital phase comparing in a digital phase locked loop circuit having an accumulator type digital voltage controlled oscillator for comparing a phase of output data from said accumulator type digital voltage controlled oscillator and a phase of input data in which a phase comparison output is fed back to an accumulator provided within said accumulator type digital voltage controlled oscillator comprising the steps of:

detecting whether a polarity of the input data is inverted from one sample of input data relative to a preceding sample of input data;

detecting an absolute value of all samples of said input data;

time delaying by a one-sample time period each sample of said input data that has been absolute value detected in the step of detecting an absolute value;

comparing each sample of input data with each preceding sample of input data obtained by the step of time delaying and providing a result of each comparison;

adjusting a respective gain of each sample of input data having an absolute value detected by said step of detecting an absolute value and a gain of the preceding sample of input data obtained by said step of time delaying in response to the result of each said comparison; and calculating the phase of input data on the basis of respective input data gain-adjusted by said step of adjusting a gain.

5. The method according to claim 4, wherein said step of calculating a phase is inhibited when the absolute value detected in said absolute value detecting step is less than a predetermined level.

6. The method according to claim 4, wherein a phase calculation of said phase calculating step is inhibited when a polarity of said input data is detected as being not inverted.

7. The method according to claim 4, further comprising a free running frequency data adding step for adding free running frequency data to phase-compared data supplied to said accumulator provided within said accumulator type digital voltage controlled oscillator.

* * * * *

UNITED STATES PATENT AND TRADEMARK OFFICE
CERTIFICATE OF CORRECTION

PATENT NO. : 5,452,326
DATED : September 19, 1995
INVENTOR(S) : Masato TANAKA

It is certified that error appears in the above-indentified patent and that said Letters Patent is hereby corrected as shown below:

Col. 1, line 33, after, "rate" delete ","

Col. 11, line 26, change "Of" to --of--
Col. 12, line 64, change "8C)of" to --8C) of--
Col. 14, line 4, change "Customary" to --customary--

Col. 15, line 20, change "Comparing" to --comparing--

Signed and Sealed this

Twenty-first Day of January, 1997

Attest:

BRUCE LEHMAN

*Attesting Officer*     *Commissioner of Patents and Trademarks*